US007389218B2

(12) United States Patent
Lee

(10) Patent No.: US 7,389,218 B2
(45) Date of Patent: Jun. 17, 2008

(54) HARDWARE AND SOFTWARE CO-SIMULATION METHOD FOR NON-BLOCKING CACHE ACCESS MECHANISM VERIFICATION

(75) Inventor: Kuen-Geeng Lee, Siaying Township, Tainan County (TW)

(73) Assignee: Faraday Technology Corp., Hsin-Chu (TW)

( * ) Notice: Subject to any disclaimer, the term of this patent is extended or adjusted under 35 U.S.C. 154(b) by 406 days.

(21) Appl. No.: 11/160,258

(22) Filed: Jun. 16, 2005

(65) Prior Publication Data

US 2007/0005328 A1  Jan. 4, 2007

(51) Int. Cl.
*G06F 9/455* (2006.01)
*G06F 11/00* (2006.01)

(52) U.S. Cl. ............................... 703/23; 703/17; 703/27; 714/29

(58) Field of Classification Search ............... 703/2, 703/17, 27, 19, 23; 707/102; 714/29
See application file for complete search history.

(56) References Cited

U.S. PATENT DOCUMENTS

| 6,912,610 | B2 * | 6/2005 | Spencer ....................... 710/240 |
| 2006/0074970 | A1 * | 4/2006 | Narayanan et al. .......... 707/102 |
| 2006/0190235 | A1 * | 8/2006 | Tzeng ......................... 703/19 |

* cited by examiner

*Primary Examiner*—Thai Phan
(74) *Attorney, Agent, or Firm*—Winston Hsu

(57) ABSTRACT

A hardware and software co-simulation method for non-blocking cache access mechanism verification is provided. The method is applied for cache access mechanism verification. First, at least one way buffer is added into the software modeling, then the hardware and software modeling are simulated. Wherein, the hardware modeling issues a trigger event for reading request when one 'outstanding miss' occurs. At this moment, the software modeling stores the data of the address to be accessed into a way buffer. When the hardware modeling obtains the data from the main memory, it issues a trigger event for reading completion, and causes for writing the data from the way buffer into the data memory of the software modeling. The verification result of the software simulation is compared with the verification result of the hardware simulation.

10 Claims, 4 Drawing Sheets

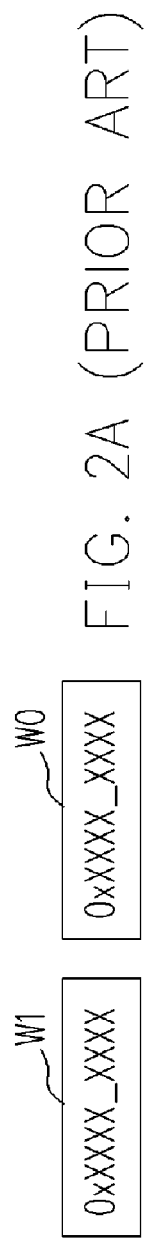
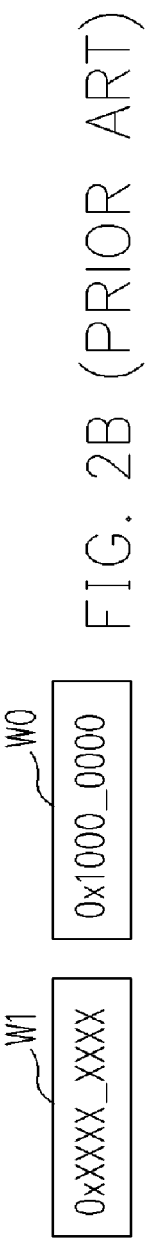
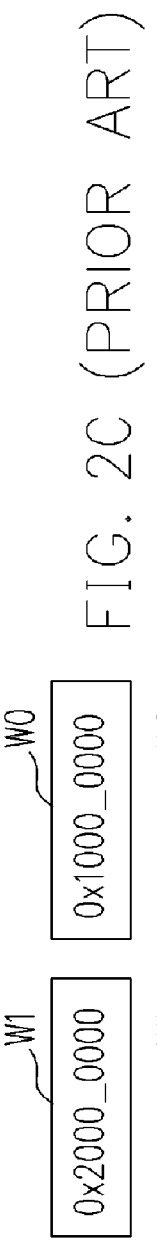
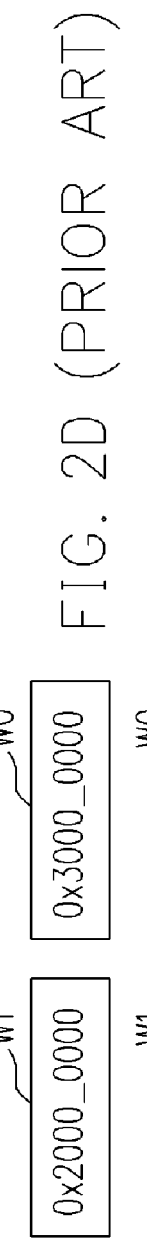
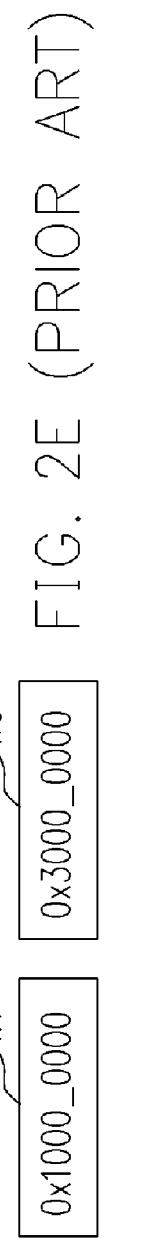

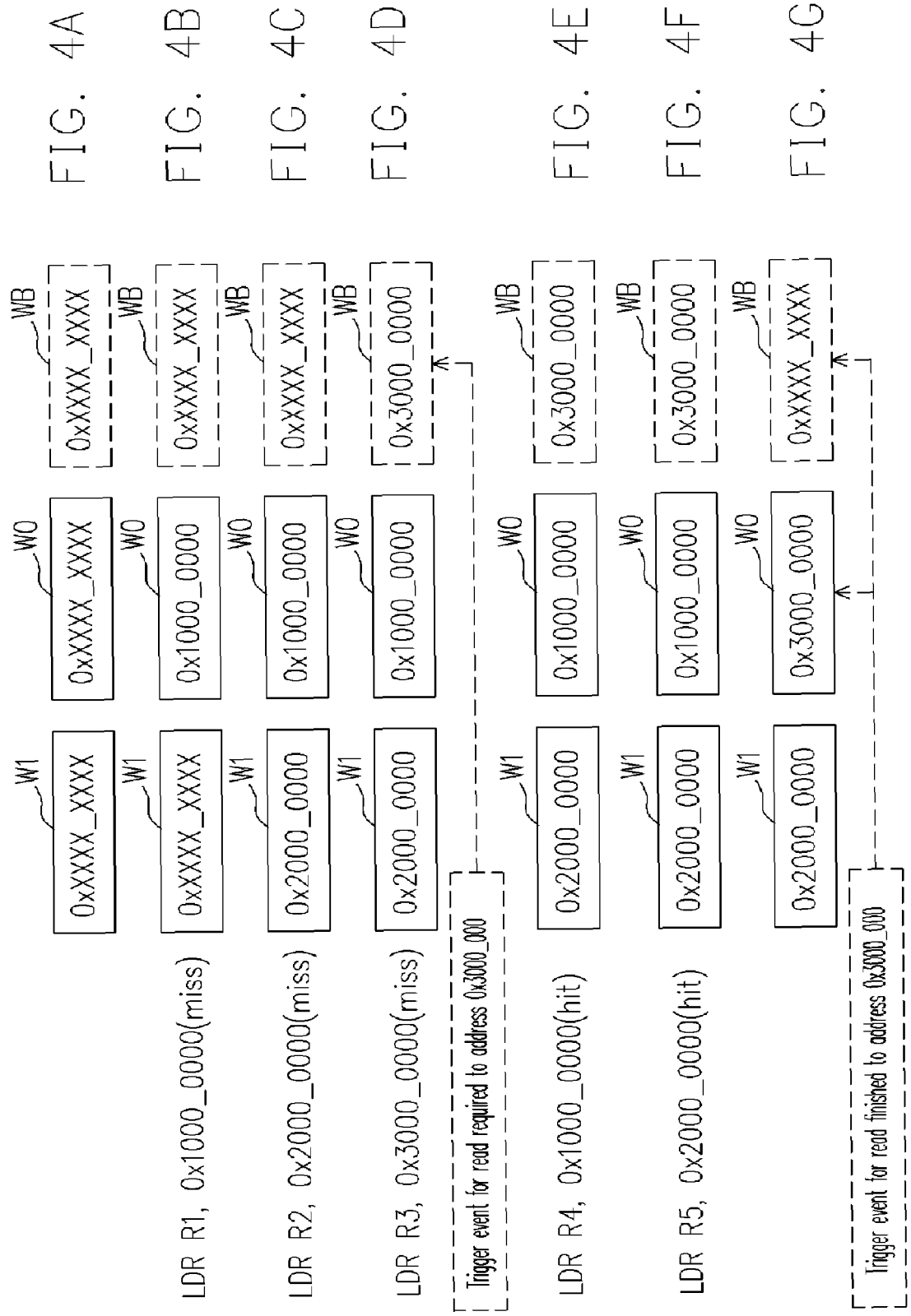

HARDWARE AND SOFTWARE CO-SIMULATION METHOD FOR NON-BLOCKING CACHE ACCESS MECHANISM VERIFICATION

BACKGROUND OF THE INVENTION

1. Field of Invention

The present invention relates to a method for circuit verification. More particularly, the present invention relates to a hardware and software co-simulation method for verifying cache access mechanism.

2. Description of Related Art

With the help of computer science, designers can use programming languages to establish software modeling for software simulation during circuit designing. By means of software simulation, designers can verify whether the function (or behavior) of circuit being designed is correct or not. Besides, designers can use hardware description language (HDL) to establish hardware modeling for hardware simulation as well, such as performing a resistor-transistor layer (RTL) simulation. Likewise, designers can verify whether the function (or behavior) of circuit being designed is correct or not by means of hardware simulation.

Mostly, designers use both hardware simulation and software simulation to verify the correctness and efficiency properties of the designed circuit. Designers can further compare the respective verification results of hardware and software co-simulation to check the reliability of the simulations.

However, the behavior verification results between the hardware simulation and the software simulation for some circuits may be different. For example, in the same non-blocking cache in pipelined CPU, the behavior verification result of software simulation differs from that of hardware simulation. That is because the software modeling is of the instruction simulation mode, during its simulation, the actual time needed by main memory to answer the requited access is neglected. FIG. 1A to FIG. 1F indicate the change of the storage state of the data memory during simulation of the hardware modeling of non-blocking cache. Here, the instructions of "LDR R1, 0×1000_0000", "LDR R2, 0×2000_0000", "LDR R3, 0×3000_0000" and "LDR R4, 0 × 1000_0000" are taken as the test pattern needed by the simulating operation.

FIG. 1A illustrates the initial states of way 0 data memory W0 and way 1 data memory W1 in the hardware modeling of non-blocking cache. In FIG. 1B, when CPU executes instruction "LDR R1, 0×1000_0000", that is, data should be read from main memory address 0×1000_0000 and stored in register R1, because the data to be read does not exist in the cache, that is usually called 'miss', the data read from main memory at address 0×1000_0000 will first be stored into the cache of data memory W0 in order to be read by CPU.

When CPU executes instruction "LDR R2, 0×2000_0000" in succession, because the data to be read is 'miss', the data will be requested and read out from main memory at address 0×2000_0000, and then stored into non-used data memory W1 so as to be read by CPU, as illustrated in FIG. 1C. In sequence, when CPU executes instruction "LDR R3, 9×3000_0000", showed in FIG. 1D, because the data to be read is 'miss' either, likewise, a read request is first issued to the main memory. In FIG. 1E, because the cache is the non-blocking cache, CPU will continue executing the next instruction "LDR R4, 0×1000_0000" not necessary to wait for data return, even though the cache has not obtained the data from main memory address 0×3000_0000.

In FIG. 1E, because the previous instruction is 'miss', the hardware modeling issues a read request to the main memory for reading and not has obtained the data yet, there is still the data of address 0×1000_0000 in the cache of data memory W0. When executing instruction "LDR R4, 0×1000_0000", the CPU then obtains the data of address 0×1000_0000 from the cache of data memory W0, which is usually called 'hit'. After the cache obtains the data from main memory address 0×3000_0000, as illustrated in FIG. 1F, it will select the data memory W1, which has not been accessed for longest time in data memories W0 to W1, to store the data.

FIG. 2A to FIG. 2E indicate the change of the storage state of the data memory during simulation of the software modeling of non-blocking cache. Herein, in the same way, the instructions of "LDR R1, 0×1000_0000", "LDR R2, 0×2000_0000", "LDR R3, 0×3000_0000" and "LDR R4, 0×1000_0000" are taken as the test samples needed by the simulation.

FIG. 2A indicates the initial states of way 0 data memory W0 and way 1 data memory W1 in the software modeling of non-blocking cache. In FIG. 2B, when CPU executes instruction "LDR R1, 0×1000_0000", because of being 'miss', the data from the main memory address 0×1000_0000 is stored into the cache of data memory W0 in order to be read by the CPU. When the CPU executes instruction "LDR R2, 0×2000_0000" in succession, as shown in FIG. 2C, because the data to be read is 'miss', a read request for reading the main memory at address 0×2000_0000 is issued and the data of the address is read out and then stored into non-used data memory W1 so as to be read by CPU.

In sequence, when the CPU executes instruction "LDR R3, 0×3000_0000", as showed in FIG. 2D, because of the data being 'miss', likewise, a request for reading is issued to the main memory. However, since it is neglected for the actual time needed by the main memory to respond the access request during the simulation of software modeling, the cache immediately obtains the data from main memory at address 0×3000_0000 and stores the data into data memory W0, which has not been accessed for the longest time in the data memory. Then, as illustrated in FIG. 2E, when the instruction "LDR R4, 0×1000_0000" is executed, because of data to be read at 0×1000_0000 being 'miss', likewise, the data is requested and read from the main memory at address 0×1000_0000 and stored in data memory W1, which has not been accessed for the longest time in the data memories W0 to W1. Therefore, the behavior verification results between hardware simulation and software simulation of non-blocking cache are not the same, so that the comparison between their simulation results can not be done for hardware and software co-simulation.

SUMMARY OF THE INVENTION

Accordingly, the present invention is directed to provide a hardware and software co-simulation method to resolve the problem that the behavior of hardware simulation of non-blocking cache dose not match with that of software simulation, and improve the reliability of verification and efficiency confirmation.

Besides, the present invention is to provide a computer readable record media in order to store the program for the foregoing method.

The present invention provides a hardware and software co-simulation method for verifying cache access mechanism. The method includes the following steps. First, the software modeling of cache is simulated by software simulation and the hardware modeling of cache is simulated by a hardware simulation. Wherein, at least one way buffer adds into the software modeling. When the data memory of the hardware modeling is fully filled and the address to be accessed is 'miss' so that a read request for is issued to the main memory, the hardware modeling issues a trigger event for reading request. When the hardware modeling obtains the data from the main memory at the accessed address, it issues a trigger event for reading completion. When the software modeling obtains the trigger event for reading request, the software modeling stores the data at the address to be accessed into a way buffer. When the software modeling obtains the trigger event for reading completion, the software modeling writes the data from the way buffer into its data memory. Finally, the verification result of the software simulation is compared with that of the hardware simulation.

In addition, the present invention is to provide a computer readable record media in order to store the program which executes in computer system for verification of cache access mechanism. The program includes following instructions: software simulation for the software modeling of the cache; hardware simulation for the hardware modeling of the cache; adding at least one way buffer into the software modeling; issuing a trigger event for reading request when the data memory of the hardware modeling is fully filled, and the address to be accessed is 'miss' so that a request for read is issued; issuing a trigger event for reading completion when the hardware modeling obtains the data from the main memory; storing the data of the address to be accessed into the way buffer of the software modeling when the software modeling obtains the trigger event for reading request; writing the data from the way buffer into the data memory of the software modeling when the software modeling obtains the trigger event for reading completion; and comparing the verification result of the software simulation with that of the hardware simulation.

In order to make the aforementioned and other objects, features and advantages of the present invention comprehensible, a preferred embodiment accompanied with figures is described in detail below.

BRIEF DESCRIPTION OF THE DRAWINGS

FIG. 1A to FIG. 1F illustrate the change of the storage state of the data memory during simulating the hardware modeling of non-blocking cache.

FIG. 2A to FIG. 2E illustrate the change of the storage state of the data memory during simulating the software modeling of non-blocking cache.

FIG. 4A to FIG. 4G are drawings, schematically illustrating the change of the storage state of the data memory during simulating the non-blocking cache to be verified, and the change of the storage state of the way buffer of the software modeling of the cache to be verified.

DESCRIPTION OF EMBODIMENT

Figure 3:
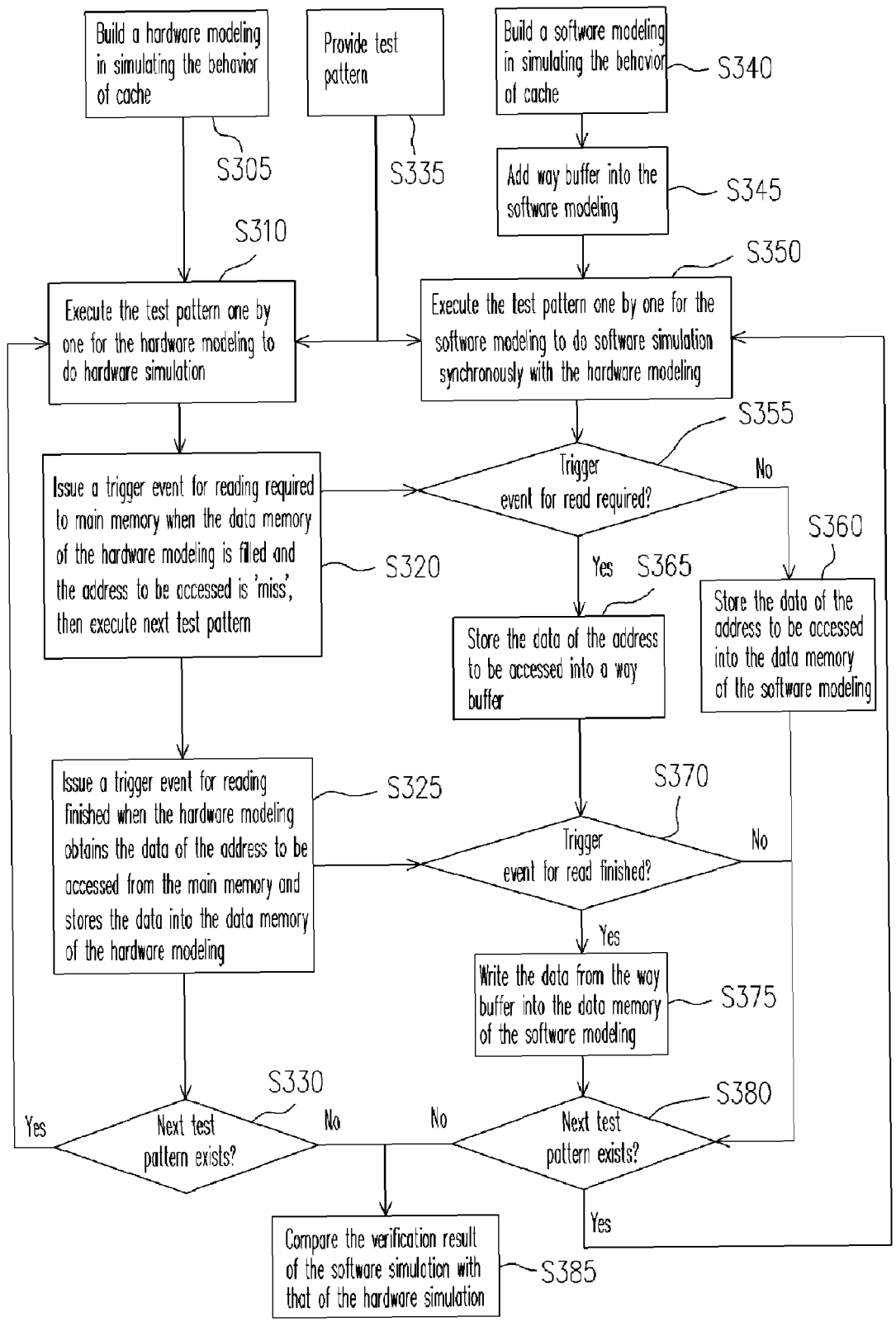
FIG. 3 is a drawing, schematically illustrating the simulating flow chart, indicating a hardware and software co-simulation method for non-blocking cache access mechanism verification, according to the preferred embodiment of the present invention.

FIG. 3 is a schematic flow chart indicating a hardware and software co-simulation method for non-blocking cache access mechanism verification according to the preferred embodiment of the present invention. In the embodiment, the cache to be verified is a non-blocking cache. As illustrated in FIG. 3, Step S305 to Step S330 are the steps for the hardware modeling of the cache to be verified to do hardware simulation; Step S340 to Step S380 are the steps for software modeling of the cache to be verified to do software simulation.

In addition, Step S335 is the step providing a test pattern respectively to the software modeling and the hardware modeling so that the hardware modeling and the software modeling can synchronously do hardware simulating and software simulating according to the same test pattern. In the embodiment the instructions of "LDR R1, 0x1000_0000", "LDR R2, 0x2000_0000", "LDR R3, 0x3000_0000", "LDR R4, 0x1000_0000" and "LDR R5, 0x2000_0000" are taken as the test pattern needed by the simulations.

In the hardware simulation, the hardware modeling is built with hardware description language (HDL) in Step S305. It is supposed herein that the cache to be verified has way 0 data memory W0 and way 1 data memory W1. FIG. 4A indicates the initial states of way 0 data memory W0 and way 1 data memory W1 in the non-blocking cache to be verified.

Step S310 is that, one by one, the hardware modeling executes the test pattern provided by Step S335 so that the hardware simulation will be done for the hardware modeling of the cache, for example, executing instruction "LDR R1, 0x1000_0000", which means reading data from the main memory at address 0x1000_0000 then storing the data into register R1. FIG. 4B indicates that when CPU executes instruction "LDR R1, 0x1000_0000", because of being 'miss', the data from main memory address 0x1000_0000 will be stored into the cache of data memory W0 in order to be read by CPU.

Because some space of data memory is still not used at this moment, no 'outstanding miss' occurring namely, Step S320 and Step 325 are not executed. After Step 330 judging whether or not there is still test pattern to be executed, Step S325 is repeated so that the hardware modeling executes the next test pattern, for example, instruction "LDR R2, 0x2000_0000". In FIG. 4C, when the CPU executes instruction "LDR R2, 0x2000_0000", because the data to be read is in 'miss', the data read from main memory address 0x2000_0000 is stored into the cache of data memory W1, in order to be read by the CPU.

In subsequence, when the hardware modeling executes instruction "LDR R3, 0x3000_0000" in Step S310, showed in FIG. 4D, because the data to be read is 'miss' and the space of the data memory of the hardware modeling is fully filled, likewise, a read request is issued to the main memory. Because the cache is non-blocking cache, the CPU continues executing next instruction "LDR R4, 0x1000_0000" in Step S320 without need to wait for the data return, namely 'outstanding miss', even though the cache has not obtained the data from main memory address 0x3000_0000. In Step S320, the hardware modeling issues a trigger event for reading required to address 0x3000_0000 at the same time.

In FIG. 4E, because the previous instruction is 'miss', a read request is issued to the main memory and the data requested has not returned yet, there is still the data at address 0x1000_0000 in the cache of data memory W0. When executing instruction "LDR R4, 0x1000_0000" at this time, the CPU obtains the data at address 0x1000_0000 from the cache of data memory W0, which is usually called 'hit'. Before obtaining the returned data, the CPU continues executing the next instruction "LDR R5, 0×2000_0000", as illustrated in FIG. 4F. The instruction is 'hit' for the data at address 0×2000_0000, therefore it can allow the CPU to read the data of address 0×2000_0000 from the cache of data memory W1.

After the cache obtains the data returning from main memory at address 0×3000_0000, a trigger event for reading completion is issued in Step S325. As illustrated in FIG. 4G, data memory W0 is selected, which has not been accessed for longest time in the data memories W0 to W1, to store the data from main memory at address 0×3000_0000.

In the aspect for the software simulation, the software modeling is built in Step S340, with, for example, a programming language. Then in Step S345, at least one way buffer is added into the software modeling. For example, as illustrated in FIG. 4A, a way buffer WB is added into the software modeling. In this embodiment, it is supposed that the degree of non-blocking of the cache to be verified is 1, that is, only one time of 'outstanding miss' is admitted in occurrence, so that only one way buffer WB is added into the software modeling. If the degree of non-blocking of the cache to be verified is n, correspondingly, n of way buffers WB are correspondingly added into the software modeling.

Next in Step S350, synchronously with the hardware modeling, the test pattern provided by Step S335 are executed one by one so that the software simulation is done for the software modeling, for example, executing instruction "LDR R1, 0×1000_0000". Then Step S355 judges whether or not a trigger event for read request occurs. Because the hardware modeling has not issued any trigger event for read request, no 'outstanding miss' occurs namely, the Step S360 is performed, w for storing the data from the main memory at address 0×1000_0000 into the cache of data memory W0, as illustrated in FIG. 4B. Next, Step S380 judges whether or not any test pattern is still exiting, then returning to Step S350 for executing the next instruction "LDR R2, 0×2000_0000". Because of data to be read being 'miss', a read request is issued for reading data from main memory at address 0×2000_0000 and the data at the address is read out and then stored into non-used data memory W1, so as to be read by CPU, as illustrated in FIG. 4C.

Next, when the software modeling executes instruction "LDR R3, 0×3000_0000" in Step S350, as illustrated in FIG. 4D, because the data to be read is 'miss' and the space of the data memory of the hardware modeling is fully filled, a 'outstanding miss' occurs in the hardware modeling which then issues a trigger event for reading request to the address 0×3000_0000. Right now, the judging result in Step S355 is 'Yes', so that Step S365 follows, that is, the software modeling stores the data at address 0×3000_0000 into the way buffer WB.

In Step S370, it is judged whether or not a trigger event for reading completion occurs. As mentioned above, it is necessary for the hardware modeling to obtain the data from the main memory after a period of time, so that the judging result in Step S370 is 'No' and the next test pattern is executed. In FIG. 4E, because the previous instruction is 'miss' so that a read request is issued to the main memory. And, the data requested, now storing in way buffer WB, has not returned yet. In this situation, the data at address 0×1000_0000 is still staying in the cache of data memory W0. When executing instruction "LDR R4, 0×1000_0000" at this moment, the CPU obtains the data at address 0×1000_0000 from the cache of data memory W0 under 'hit'. Before obtaining the data being returned, that is, the hardware modeling does not issue the trigger event for reading completion, so that the next instruction "LDR R5, 0×2000_0000" is continuously executed, as illustrated in FIG. 4F. The instruction at this moment is 'hit' with respect to the data at address 0×2000_0000, so that the CPU can obtain the data from the cache of data memory W1.

When the hardware modeling obtains the data from the main memory at address 0×3000_0000, that is, it issues a trigger event for reading completion, in which Step S370 judges to be 'Yes'. Then the software modeling goes to Step S375 to write the data stored in way buffer WB into its data memory W0, which has not been accessed for the longest time in the data memory.

Finally, in Step S385, the verification result of the software simulation is compared with that of the hardware simulation. Although the comparison between the two verification results here occurs after the end of the software simulation and the hardware simulation, as understood by those ordinary skilled in the art, the comparison can be performed for each in the test pattern.

In summary, according to the present invention, a corresponding number of way buffers can be added into the software modeling in accordance with the degree of non-blocking of the cache to be verified. When 'outstanding miss' occurs during hardware simulation, the software modeling synchronously stores the data at the address to be accessed into its way buffer. Only when the hardware modeling obtains the data at the address to be accessed from the main memory, the software modeling then writes the data stored in its way buffer into its data memory. Therefore, the present invention can resolve the problem that the behavior of hardware simulation of non-blocking cache dose not match with that of software simulation, and improve the reliability of verification and efficiency confirmation.

The present invention is disclosed above with one of its preferred embodiment. It is to be understood that the preferred embodiment of present invention is not to be taken in a limiting sense. It will be apparent to those skilled in the art that various modifications and variations can be made to the structure of the present invention without departing from the scope or spirit of the invention. The protection scope of the present invention is in accordant with the scope of the following claims and their equivalents.

What is claimed is:

1. A hardware and software co-simulation method for verifying access mechanism for a cache, comprising:
   performing a software simulation for a software modeling of the cache;
   performing a hardware simulation for a hardware modeling of the cache;
   adding at lease one way buffer into the software modeling;
   issuing a trigger event for reading request, when a data memory of the hardware modeling is fully filled, and an address to be accessed is 'miss' and a read request is issued to a main memory;
   issuing a trigger event for reading completion when the hardware modeling obtains the data from the main memory at the address to be accessed;
   storing the data of the address to be accessed into the way buffer of the software modeling when the software modeling obtains the trigger event for reading request;
   writing the data from the way buffer into a data memory of the software modeling when the software modeling obtains the trigger event for reading completion; and
   comparing verification results of the software simulation and the hardware simulation.

2. The hardware and software co-simulation method as claimed in claim 1, further comprising:
 providing a test pattern respectively to the software modeling and the hardware modeling; and
 conducting the hardware modeling and the software modeling to respectively and synchronously do the hardware simulation and the software simulation, according to the same test pattern.

3. The hardware and software co-simulation method as claimed in claim 1, wherein, the cache is a non-blocking cache.

4. The hardware and software co-simulation method as claimed in claim 1, wherein, the software modeling is built with programming language.

5. The hardware and software co-simulation method as claimed in claim 1, wherein, the hardware modeling is built with hardware description language (HDL).

6. A computer readable media, used to store a program which can be executed in a computer system for verifying a cache access mechanism of a cache, the program comprising sets of instructions for:
 performing a software simulation for a software modeling of the cache;
 performing a hardware simulation for a hardware modeling of the cache;
 adding at lease one way buffer into the software modeling;
 issuing a trigger event for reading request, when a data memory of the hardware modeling is fully filled, and an address to be accessed is 'miss' and a read request is issued to a main memory;
 issuing a trigger event for reading completion when the hardware modeling obtains the data from the main memory at the address to be accessed;
 storing the data of the address to be accessed into the way buffer of the software modeling when the software modeling obtains the trigger event for reading request;
 writing the data from the way buffer into a data memory of the software modeling when the software modeling obtains the trigger event for reading completion; and
 comparing verification results of the software simulation and the hardware simulation.

7. The computer readable record media as claimed in claim 6, wherein the program further comprises following sets of instructions for:
 providing a test pattern respectively to the software modeling and the hardware modeling; and
 conducting the hardware modeling and the software modeling to respectively and synchronously do the hardware simulation and the software simulation, according to the same test pattern.

8. The computer readable record media as claimed in claim 6, wherein, the cache is a non-blocking cache.

9. The computer readable record media as claimed in claim 6, wherein, the software modeling is built with programming language.

10. The computer readable record media as claimed in claim 6, wherein, the hardware modeling is built with hardware description language (HDL).

* * * * *